United States Patent
Walf et al.

(10) Patent No.: US 7,728,313 B2
(45) Date of Patent: Jun. 1, 2010

(54) MASKLESS LITHOGRAPHY SYSTEM AND METHOD USING OPTICAL SIGNALS

(75) Inventors: Godhard Walf, Berlin (DE); Berndt Kuhlow, Berlin (DE)

(73) Assignee: Fraunhofer-Gesellschaft zur Foerderung der angewandten Forschung e.V., Munich (DE)

(*) Notice: Subject to any disclaimer, the term of this patent is extended or adjusted under 35 U.S.C. 154(b) by 636 days.

(21) Appl. No.: 11/260,165

(22) Filed: Oct. 28, 2005

(65) Prior Publication Data

US 2006/0109445 A1 May 25, 2006

Related U.S. Application Data

(63) Continuation of application No. PCT/DE2004/000924, filed on Apr. 29, 2004.

(30) Foreign Application Priority Data

Apr. 29, 2003 (DE) ................ 103 19 154

(51) Int. Cl.
*G21K 5/10* (2006.01)
(52) U.S. Cl. ............. 250/492.22; 250/492.23; 355/53
(58) Field of Classification Search .......... 355/67, 355/53; 430/5; 250/398, 492.2, 492.21, 250/492.22, 492.23, 492.3
See application file for complete search history.

(56) References Cited

U.S. PATENT DOCUMENTS

| 5,910,658 | A | 6/1999 | Arai et al. |
| 6,356,616 | B1 | 3/2002 | Oshino |
| 6,379,867 | B1 | 4/2002 | Mei et al. |
| 6,958,804 | B2 * | 10/2005 | Wieland et al. ............... 355/67 |

2002/0145113 A1 * 10/2002 Sullivan et al. ............. 250/311

FOREIGN PATENT DOCUMENTS

DE 100 36 237 A1 2/2001

(Continued)

OTHER PUBLICATIONS

"OFDM-Vermittlungssytem mit 3d-Raumstufen," Chapter D.6 of Final Report of the project "Optical Signal Processing", edited by the Heinrich-Hertz-Institut für Nachrichtentechnik Berlin GmbH, Jul. 1994, pp. D.6-1 to D.6-12.

(Continued)

*Primary Examiner*—Peter B Kim
*Assistant Examiner*—Chia-how Michael Liu
(74) *Attorney, Agent, or Firm*—Keating & Bennett, LLP

(57) ABSTRACT

In a lithographic system, data transmission is carried out by a powerful electro-optical free-beam connection system enabling optical pattern data to be guided from light exit places to light entrance places inside the vacuum chamber by free-space optical beams in order to produce control signals. The burden on the pattern production system is significantly reduced by the disappearance of mechanical and electrical contacts. The paths of the free-space optical beams and the particle beams can intersect each other in a non-influential manner. Active photodiodes acting as light exit places can be spatially disposed directly in the pattern production system. Passive light waveguides which can be bundled together to form multipolar fibre array plugs, or active transmission lasers, either of which can also act as light exit places, can be arranged outside the vacuum chamber.

25 Claims, 8 Drawing Sheets

FOREIGN PATENT DOCUMENTS

| | | |
|---|---|---|
| EP | 0 485 071 A2 | 5/1992 |
| EP | 0 903 231 A2 | 3/1999 |
| JP | 06-303198 A | 10/1994 |
| JP | 07-131422 A | 5/1995 |
| WO | WO 91/10170 A1 | 7/1991 |
| WO | WO 02/082187 A1 | 10/2002 |
| WO | 2004/038509 A2 | 5/2004 |
| WO | WO 2005/010618 A2 | 2/2005 |

OTHER PUBLICATIONS

I. L. Berry et al., "Programmable Aperture Plate for Maskless High Throughput Nanolithography", Journal of Vacuum Science and Technology, B, 1997, vol. 15, No. 6, pp. 2382 to 2386.

Xanoptix Internet page www.xanoptix.com/ferrule.htm; status of Mar. 14, 2003, 2 pages.

Xanoptix Internet page www.xanoptix.com/highdensity.htm; status of Mar. 14, 2003, 1 page.

Rai-Choudhury, "Handbook of Microlithography, Micromachining and Microfabrication vol. 1: Microlithography," SPIE Optical Engineering Press, 1997, pp. 142-145.

Thornley et al., "Electron-Optical Fabrication of Solid-State Devices," Record of the 9th Symposium on Electron, Ion, Laser Beam Technology, San Francisco Press, 1967, pp. 94-100.

Chang, "Instrumentation for Electron Beam Lithography," IEEE Transactions on Magnetics, vol. 10, Issue 3, Sept. 1974, pp. 883-887.

Official Communication issued in corresponding European Patent Application No. 04730199.9, mailed on Jan. 14, 2010.

Official Communication issued in corresponding Japanese Patent Application No. 2006-504314, mailed on Jan. 26, 2010.

* cited by examiner

MASKLESS LITHOGRAPHY SYSTEM AND METHOD USING OPTICAL SIGNALS

This application is a continuation of International Patent Application No. PCT/DE2004/000924 filed Apr. 29, 2004, the publication of which by the International Bureau was not in the English language. This application also claims priority under 35 U.S.C. 119(d) to German Patent Application No. DE 103 19 154.2, filed Apr. 29, 2003. The entire contents of each of the above-identified applications are incorporated herein by reference.

BACKGROUND

1. Field of the Invention

The present invention relates to a maskless lithography system for direct, nano-scale capable structuring of a substrate disposed on a movable mounting table in a vacuum chamber supplied with a high voltage, using a charged particle beam generated by a beam source, and an addressable digital pattern generating system onto which the structure pattern to be generated is transmitted as a set of pattern data generated with computer assistance using a data transmission system.

2. Brief Description of Related Art

Particle beam lithography plays a major role in the manufacture of devices in the field of microsystem-technology and monolithically integrated circuits in electronic, opto-electronic, optical and other embodiments, and their individual components, which comprise nano-sized structures measuring 100 nanometers and less. The geometrical structure to be produced on a substrate, typically a wafer, is converted into a set of pattern data with the assistance of a computer. Said set of pattern data is either used for manufacturing a mask that cannot be changed, a large area of which is being irradiated (indirect structuring technique), or said set of pattern data is continually worked off by suitably addressing the particle beam and the mounting table, on which the substrate to be structured is disposed (direct structuring technique). The indirect structuring technique is advantageous in that it enables parallel, and therefore very fast realization of the structure pattern. It has, however, also a disadvantage because of the extremely expensive manufacturing of the masks which can only be balanced by mass production of circuit layouts, because of the transfer of errors in the mask and because of the rather complex alignment when the mask is brought into position. Therefore, at present the direct structuring technique is being intensively developed further, since it offers the great advantage of flexibility with respect to the geometrical structure patterns that can be manufactured, which makes it ultimately less costly. However, this method has the disadvantage of a relatively low through-put of substrates as a result of the slow, serial structuring process employing the particle beam. Therefore, a greatest possible parallelization is also aimed at in the direct structuring method. For achieving this parallelization, different concepts are being pursued. On one hand, a plurality of parallel particle beams may be generated; on the other hand a programmable, changeable mask comprising electrically-addressed individual elements (apertures) as a pattern generating system may be irradiated with a homogeneous particle beam having a large cross section. The data rate, which needs to be processed in this preferred concept and which comprises the data for addressing the digitized structure pattern having 600,000 mask points, for instance, which are usually irradiated several times (grey scale system, comparable to the principle of the ink jet printer), and the addressing of the mounting table, is extremely high, and easily reaches several Tbit/s, such that suitable transmission of the data rate to the pattern generating system inside the vacuum chamber of the lithography system constitutes a particular problem associated with the direct structuring technique.

U.S. Pat. No. 6,379,867 B1 discloses a lithography system that is designated "maskless" since no unchangeable, rigid mask in a conventional sense is employed. Rather, the pattern generating system is configured as a pixel panel, which comprises a plurality of addressable individual elements, for instance, formed by digital mirror devices (DMD), which either transmit or block the light beam. The pattern to be generated is generated as a bitmap with the assistance of a computer, it is then stored in a storage device, and transmitted from there via a wire-bound signal connection to the pattern generating system. The data transmission system is based exclusively on a wired connection. Therefore, in order to achieve the high data transmission rate, a multitude of wire-bound data lines needs to be guided into the inside of the vacuum chamber of the lithography system, and needs to be contacted there. Thus, problems arise with the respect to their spatial arrangement and allocation, and in particular with respect to the mechanical fixation of the data lines to the carrier plate of the individual element to be addressed. Furthermore, removing the data lines for purposes of maintenance in the vacuum chamber is very complex. In addition, negative effects on the data to be transmitted may occur due to the conditions inside the vacuum chamber, in particular due to the applied high voltage.

SUMMARY

It is an object of the present invention to provide a lithography system having an addressable pattern generation system and having a data transmission system which enables even highest data rates to be transmitted reliably to the inside of the vacuum chamber, and in particular in which no mechanical strain on the pattern generating system due to contacts or any space related problems occur. It is an additional object to provide simple allocation of the transferred data to the addressable individual elements in the pattern generating system. It is a further object for the data transmission system according to the present invention to be robust in terms of operation and to allow easy assembly and disassembly.

Exemplary lithography systems according to the present invention provide an opto-electrical free-space beam connection system as the data transmission system, by which the pattern data optically converted to corresponding optical signals by electro-optical converters are distributed at light exit locations, such that the pattern data embodied in the optical signals are transmitted by optical free-space beams (i.e., optical beams not bound to a material medium, also called "free beams" herein) whose orientation is adjustable. The adjustable optical free beams are transmitted onto light entry locations inside the vacuum chamber, from where they are guided to opto-electrical converters, which are associated with the pattern generating system with respect to the transmitted pattern data. The number N of the electro-optical converters can be adapted to the pattern data rate to be transmitted, based on their predetermined conversion rate.

Such an arrangement facilitates both the transformation of the high data rate to be transmitted into the efficient optical range as well as the data transfer in a free beam connection system, which date transfer is not dependent on wiring (data lines). The opto-electrical data transmission system in the lithography system permits keeping the pattern generating system free from cumbersome wire-bound and mechanically straining connections to the outside, and thus enables relief from mechanical strain. Therefore, upon assembling or maintaining the lithography system, cumbersome wired connections for data transmission do not need to be made or removed directly at the pattern generating system. In the present invention, the entire data transmission is based purely on optics and is independent of wiring, at least directly in front of the pattern generating system, owing to the integration of a free beam connection system. The opto-electrical data transmission system is very efficient, so that even the highest data rates can be transmitted. The electro-optically converted data are guided as parallel free beams directly to the pattern generating system, with the number of the parallel free beams being adapted to the data rate to be transmitted via the predetermined transmission rate of the electro-optical converters. Assuming an exemplary data rate of 10 Gbits/s per electro-optical converter, 256 parallel free beams are required for transmitting a data rate of 2.56 Tbit/s. These parallel free beams' paths are directed at the opto-electrical converters in the pattern generating system. From there, the data, which are converted into electrical signals, are guided to the individual elements of the pattern generating system via subsequent signal processing. In an exemplary embodiment, the opto-electrical converters in the pattern generating system accordingly detect the incoming optical data at their data rate of 10 Gbits/s. In the region of the free beams, which are independent of wiring, the light serving as the data carrier in the vacuum chamber is neither influenced by the high voltage present therein during structuring, nor by the particle beam, whose particles are usually ions or electrons. This has a great advantage in that the data can be optically irradiated directly onto the opto-electrical converter—accepting that their paths cross the particles' paths—without occurrence of any problems with respect to potentials. Space consuming and complex bundles of wiring and their mechanical contacting are not required.

Different embodiments of an optical free beam connection system, which may be used in the present invention, are generally known form the state of the art, typically, however, in the context of powerful communication devices, but also for data transmission to inaccessible locations (see for instance, EP 0 485 071 A2, therein data transmission to a hermetically encapsulated device underwater is described), or to locations which are difficult to contact (see for instance DE 100 36 237 A1, therein a modular construction of a machine of individual, electrically controlled functional units is described, between which data are optically transmitted). From the final report of the project "Optical Signal Processing" (edited by the Heinrich-Hertz-Institut für Nachrichtentechnik Berlin GmbH, July 1994, Chapter D.6.2.2), for instance, an optical 3D spatial step is known, which is formed by a cascaded electronic circuit and optical free beam connection steps comprising Fresnel zone lenses for collimating or focusing, respectively, as well as volume holograms for beam deflection. It is a free beam connection network for transmission of transmission rates in a Gbit range, as it may be used for optical signal processing in an OFDM-switching system.

The free beam connection system in the lithography device according to the present invention is, in the present context, principally understood as a serial combination of light exit locations functioning as optical emitters (for instance active light emitters, such as electro-optical converters, for instance laser diodes, or exits of light wave guides), free beams independent of wires (wire-unbound) and light entry locations functioning as optical receivers (for instance active receiving elements, such as opto-electrical converters, for instance photo diodes, or entrances of light waveguides). It is optional how the data are provided and picked up at the light entry and light exit locations. Furthermore, the positioning of the free beam connection system may be chosen freely and is therefore adaptable in particular to the constructional environment and requirements. In a simplest embodiment, the free beam connection system comprising the components listed above is disposed directly in front of the pattern generating system. The distance covered by the free beam is therefore very short. The contact-free data input allows the pattern generating system to be relieved from mechanical strain, which is one of the main objects of the present invention. In this embodiment, the data transmission to the electro-optical converters may take place in a wire-bound manner (electrically or optically), wherein passages for wires need to be provided in the wall of the vacuum chamber, accordingly. Furthermore, the light exit locations of the free beam connection system inside the vacuum chamber may be disposed at a greater distance from the pattern generating system, which results in a lengthening of the distance covered by the free beams. In this respect, it is advantageous, if, according to an exemplary embodiment of the present invention, optical deflection arrangements are disposed in the free beams inside the vacuum chamber. Thus, any constructional environments inside the vacuum chamber may be accommodated and the free beams guided to the light entry locations irrespective of these constructional environments. The deflection arrangements, which may be disposed in the middle of the free beam distance, or also directly in front of the light exit or entry locations, may be provided by adjustable micro mirrors or micro prisms, for example.

According to a further embodiment of the present invention, the light exit locations may be disposed outside the vacuum chamber, and the free beams may be guided into the vacuum chamber through a light transparent window in the vacuum chamber. In this way, the data transmission to the inside of the vacuum chamber is already independent of wiring and achieved by free beams. The free beams are guided simply through a window, which is integrated into the wall of the vacuum chamber. When the light exit locations are positioned outside the vacuum chamber, space requirements and efforts associated with mounting the free beam connection system inside the vacuum chamber are reduced. No passage for any wiring for data transmission into the inside of the vacuum chamber is required, and a complete decoupling from the high vacuum and from the high voltage fields inside the vacuum chamber results. Deflection of the free beams, which enter the inside through the window, onto the opto-electrical converters is again readily achieved by optical deflection arrangements. Any suitable deflector may be used. In order to save space outside the vacuum chamber also, a further embodiment of the present invention provides that the light exit locations are disposed directly at the window from the outside. Thereby, a series of further constructional simplifications may result, which are discussed further below. In addition, the light exit locations may advantageously be disposed orthogonally below the window, and the free beams may be guided via an additional optical deflection arrangement through the window into the inside of the vacuum chamber. Thus, deflection arrangements may also be provided outside the vacuum chamber in order to be able to guide the free beams in an optimal space saving manner. Finally, according to a further embodiment of the present invention, the window may also be recessed into the vacuum chamber. This enables a space saving positioning of the light exit locations on the outside, but still within the region of the vacuum chamber. Furthermore, predetermined optical distances may be met more easily. This is described in more detail later on in the general description and the exemplary embodiments. In order to avoid interfering influences due to stray light and other effects, when free beams are irradiated from external light exit locations through the window, it is particularly advantageous if the window is provided with a cover shielding against external light and electromagnetic fields in a region outside of the passing free beams. The covers may be simple mechanical or optical covers. Furthermore, the free beams may be grouped into arrays, which are locally precisely defined and whose surrounding is therefore easier to cover.

Using suitable light sources, the generated free beams may be guided without use of any further optical measures over short distances in a cm range, in particular. However, it is preferable if, according to a further embodiment of the lithography system according to the present invention, collimating and focusing micro lenses are disposed at at least one of the light exit locations and light entry locations. This allows grouping and exact orientation of the free beams. At which position micro lenses are disposed in the free beams depends on the quality of the individual employed elements. Furthermore, losses due to large diffraction angles is avoided, and angular arrangement of the free beams from the light exit locations and towards the light entry locations is possible. The micro lenses may, for instance, be configured as Grin or Fresnel zone lenses. Due to their optical properties, they may only be used in connection with relatively small free beam distances. As already described above, arrangement of the light exit locations in an array is advantageous and saves space. The same also applies to arranging the light entry locations in a common array. In these embodiments of the present invention, the array may be one dimensional, forming a line or column, or, in a compact embodiment, it may be two dimensional with lines and columns of light entry locations and light exit locations, respectively. If an array arrangement is used, according to a further exemplary embodiment of the present invention, the array of the light exit locations may advantageously be imaged by an imaging optics onto the array of light entry locations. Thereby, also longer distances covered by the free beams from 10 cm up to the range of meters can be realized. If an imaging ratio of 1:1 is chosen, and if a simple imaging lens is used as the imaging optics, said imaging lens needs to be disposed symmetrically between the light exit locations and the light entry locations (object width=image width). In order to avoid distances becoming too long, the window may be moved into the vacuum chamber, for instance, as already described above. If other imaging ratios are chosen, or if more complex lens arrangements employed as imaging optics, asymmetric arrangements of the imaging optics or differences in size of the array dimensions may be considered, accordingly. If an imaging lens is employed, the light entry locations inside the vacuum chamber need to have an arrangement relative to the light exit locations, which is mirror-inverted with respect to the vertical and/or horizontal middle axis (depending on the embodiment of the imaging lens).

As already discussed above, the light exit locations in free beam connection systems serve to emit light and the light entry locations serve to receive light. The locations may differ in terms of their construction, and in particular, they may be configured to be passive or active. In accordance with a further embodiment of the present invention, the light entry locations and/or light exit locations may be formed by the ends of light waveguides. Thus, in this passive embodiment, the data may be already optically converted and then guided to the light exit locations, in particular, by light waveguides. Furthermore, the light entry locations may also be connected via light waveguides with the opto-electrical converters. The light waveguides may be provided by light fibers which are suitable for being combined into a bundle, for instance glass fibers, which show little loss and are not prone to interferences, or by monolithically integrated waveguides. Furthermore, if the light waveguides are formed by light fibers, the ends of the light waveguides may be combined into a bundle to form a fiber array plug. Use of fiber array plugs makes maintenance particularly easy and allows easy maintenance. Furthermore, susceptibility to errors is reduced, since the individual light waveguides are fixedly arranged in the fiber array plugs, and fiber array plugs enable correctly aligned and allocated connections. When using 256 parallel light waveguides, as an example, four connection bundles comprising 64 light waveguides each may be formed. Each bundle then terminates in a "64 pole" fiber array plug. Fiber array plugs of this kind ("Ferrel") are generally known in the art (see for instance internet page www.xanoptix.com/Ferrell.htm; status of Mar. 14, 2003) and are commercially available.

If the light exit locations are configured to be active, a further embodiment of the present invention advantageously provides that the electro-optical converters as light exit locations are configured as emitting lasers. Thus, electro-optical conversion of the pattern data occurs only directly at the light exit location. Providing a wire-unbound feed line to the emitting laser does not cause any problems, in particular if the feed line is disposed outside the vacuum chamber. Active light entry locations may also be realized by configuring the opto-electrical converters as light entry locations formed by photodiodes, according to a further embodiment of the present invention. The data are opto-electrically converted directly in the light entry locations and passed on in a wire-bound system. In an embodiment comprising active emitting elements (for instance emitting lasers) and active receiving elements (for instance photodiodes), no light waveguides are required, which results in a particularly compact embodiment. Other active components may also be used. The opto-electrical converters formed by photo diodes require less than 50 micrometers of space, for instance. Assuming a distance between the individual photo diodes in a range of 250 micrometers to 500 micrometers, for transmitting a sum data rate of 2.56 Tb/s by 256 parallel light waveguides and thus 256 photodiodes arranged in a row, each of which is used for addressing a group of individual elements (apertures), a space requirement for the diode array in the one direction of between 64 mm and 128 mm results. Such a band-shaped diode array may be disposed on the so called "blanking plate", which holds programmable chips comprising the individual apertures, in a known lithography system. Such a programmable aperture system is known, for instance, from the abstract of the publication "Programmable Aperture Plate for Maskless High Throughput Nanolithography", by I. L. Berry, et al.; (Journal of Vacuum Science and Technology, B, 1997, Volume 15, No. 6, pages 2382 to 2386). A particular advantage of the lithography system according to the present invention, however, lies in the option that light beams and particle beams may cross one another in the vacuum chamber, and that therefore, there is the option of a free choice of arrangement and accessibility of the opto-electrical converters. That way, particularly space saving arrangements may be realized. Furthermore, major advantages result from the speed of data transmission of the blanking plate, since shorter distances may be realized. According to a further embodiment of the lithography system according to the present invention, it is therefore advantageous if the opto-electrical converter is disposed directly in the pattern generating system. Accessibility of the converters via the free space distance in the vacuum chamber is always granted. Complex, sensitive and obstructing wiring, which is also critical with respect to achievable data speeds, is not required. In exemplary embodiments, the pattern generating system can be configured as a programmable aperture plate system, and the photodiodes may thus be distributed over the blanking plate and may be allocated there to groups of apertures via multiplex elements, whereby a major simplification of the arrangement and spacing savings can be achieved.

The free light beam carrying data on the respective optical light path is typically focused and collimated by optical elements and, accordingly, oriented in terms of its path direction. Upon assembly, maintenance or even during operation, undesired changes of adjustment may occur due to mechanical tolerances and changes of shape, both upon alignment of the beam as well as at the location of the detector or converter, respectively. Therefore, it is advantageous if, according to an exemplary embodiment, an adjustment system is provided for aligning the free beams with the light entry locations, which adjustment system lends itself to automation. The adjustment system may already directly access the light exit location, and produce a correction of the position of the light exit locations, for instance. According to a further embodiment of the present invention, the adjustment system may be disposed in the beam path of the free beam connection system. Thus, the correction in the optical range is effected by respective optics, which is easy to realize from a constructional point of view. Furthermore, electrical or optical feedback signals from the vacuum chamber may be used for alignment. According to a further embodiment of the present invention, it is advantageous if additional electro-optical converters are disposed in a region of the pattern generating system, by which further optical signals in a back direction, in particular monitoring and control signals, may be generated and guided via free beams onto additional opto-electrical converters, wherein the further optical signals may be used as feedback signals for the adjustment system, which may be automated. Four-quadrant-photodiodes may be used for detection, for instance, which enable precise orientation of the beam by suitable adjustment arrangements, for instance in a beam path, on the basis of divided quadrants measurements. This back path may also be used to transmit test sequences—once or at repeated time intervals—which provide information on the proper functionality of the optical data transmission system and the structuring system.

The present invention can facilitate electro-optical data transmission into and from a closed, badly accessible space having extreme conditions on its inside using a free beam connection system. Additionally, it is, however, possible—at least for relatively small amounts of energy—to realize an optical transmission of energy into the inside of the vacuum chamber without use of wires, in order to induce a process in the vacuum chamber, for instance, such as a switching process, to generate an electrostatic field or to charge up an energy storage. According to a further embodiment of the present invention, an optical energy transmission onto the addressable pattern generating system may be advantageously carried out using the opto-electrical free beam connection system.

BRIEF DESCRIPTION OF THE DRAWINGS

The forgoing as well as other advantageous features of the invention will be more apparent from the following detailed description of exemplary embodiments of the invention with reference to the accompanying schematic drawings, which may be depicted in a slightly extended view for the sake of clarity.

DETAILED DESCRIPTION OF EXEMPLARY EMBODIMENTS

Figure 1:
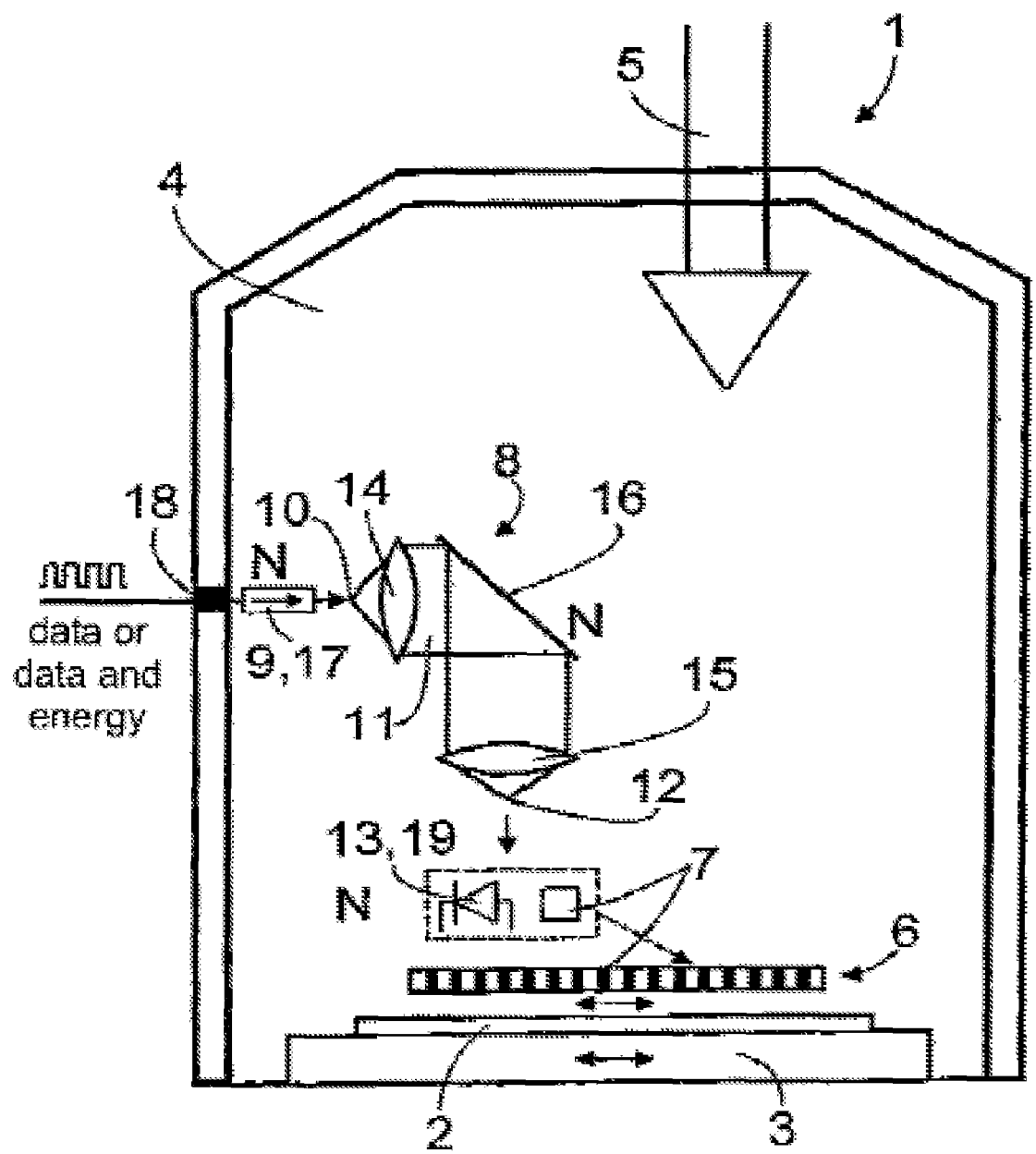
FIG. 1 shows a free beam connection system, which is disposed entirely within the vacuum chamber.

FIG. 1 schematically shows a section of a maskless lithography system 1 according to the present invention for direct, nano-scaleable structuring of a substrate 2, for instance a wafer made of silicon, which is disposed on a moveable mounting table 3. A cross-section of vacuum chamber 4 is depicted, the vacuum chamber 4 having a potential of 100 kV, for instance, on the inside. A homogeneous, broad particle beam 5, comprising electrons in this instance, is guided from the particle source, which is disposed in high vacuum, from the top into the vacuum chamber 4, wherein it is incident on an addressable pattern generating system 6 disposed above substrate 2. In the pattern generating system 6, which preferably is a programmable aperture plate system, a digital structuring pattern for irradiating substrate 2 with the particle beam 5 is generated with the assistance of a computer. To this effect, individually addressable apertures 7, which form the points of the structure or individual elements, respectively, are addressed in dependence of their positions in the structuring pattern to be generated and in dependence of their positions above the moveable substrate 2. In case of very fine structures and a high irradiating speed, the data rate to be transferred is very high and may be in the range of Tbit/s.

The pattern generating system 6 receives the data for the addressing process via an opto-electrical free beam connection system 8 (also referred to as a data transmission system). In the depicted embodiments, said system comprises electro-optical converters 9, light exit locations 10, free-space beams 11 (i.e., optical beams not bound to a material medium, which may also be referred to herein as free beams), light entry locations 12 and opto-electrical converters 13. The electrical pattern data are converted electro-optically to optical signals, and the optical signals (which may also be referred to herein as pattern data for brevity) are then transmitted by free beams 11 onto the pattern generating system 8, and are further processed there as control data, after their opto-electrical conversion. The number N of free beams 11 (and thus of the electro-optic converters 9 and the opto-electrical converters 13) is adapted to the transmitted total-data-rate via the predetermined conversion rates of the electro-optical converter 9.

In this context, it is to be noted at this point that the individually depicted components may be arranged as an array. For the transmission of a data rate of 2.56 Tbit/s, N=256 parallel free beams 11 with a data rate of 10 Gbit/s to be generated by the electro-optical converters 9 are required.

In the depicted embodiment, both the light exit locations 10 as well as the light entry locations 12 (each depicted schematically) are disposed within the vacuum chamber 4. In this way, a very short free beam distance may be realized which serves to mechanically relieve the pattern generating system 8 by rendering contacting unnecessary. In this case, the free beams 11 may be grouped by collimating microlenses 14 and focusing microlenses 15. For deflection, the free beams 11 are deflected by deflection arrangement 16, for instance micromirrors, by 90°, in the depicted embodiment. The deflection arrangements 16 are principally arranged such that the particle beam 5 is not impeded. In the depicted embodiments, the light exit locations 10 are formed directly by active emitting lasers 17 as electro-optical converters 9. The pattern data, which are thus provided as electrical signals, are supplied in a wire-bound fashion using wires, which are guided through passages 18 in the wall of the vacuum chamber 4. If the electro-optical converters 9 are disposed outside the vacuum chamber 4, supply of optically converted data to the inside of the vacuum chamber may also be carried out using light waveguides. The light exit locations 10 are then disposed at the ends of the light waveguides. The light entry locations 12 are formed directly by receiving elements, in the depicted embodiment, for instance by photodiodes 19, as opto-electrical converters 13. Optionally, in such an embodiment having a very short free beam distance, microlenses 14, 15 may also be omitted.

Figure 2:
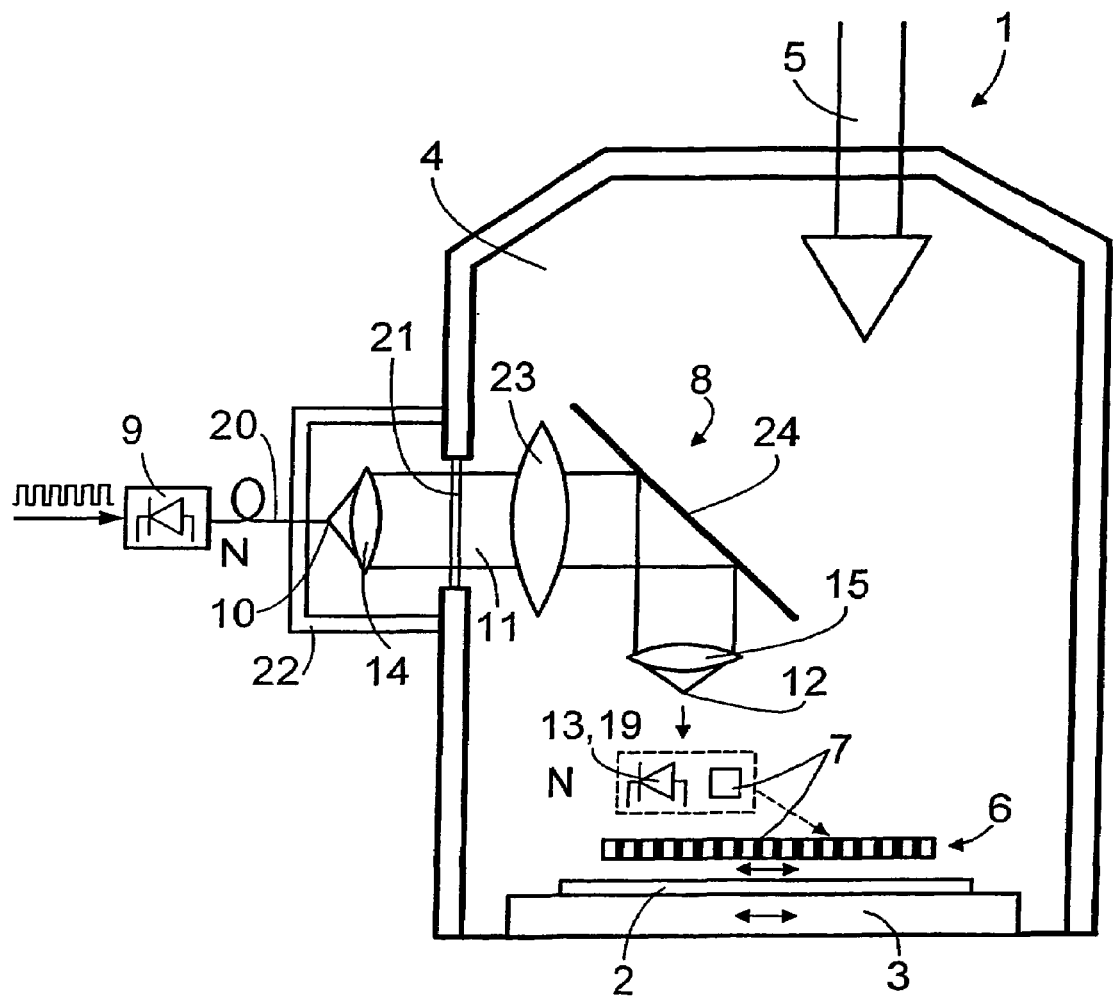
FIG. 2 shows a free beam connection system wherein light exit locations are disposed linearly outside the vacuum chamber.

In FIG. 2, an embodiment of the present invention having a long free beam distance is shown, in which light exit locations 10 of the free beam connection system 8 are disposed outside the vacuum chamber 4 and are formed by the ends of passive light waveguides 20, at the front end of which electro-optical converters 9 are positioned (active emitting elements are also possible in this case). Also in this embodiment, pre-collimating microlenses 14 may be provided at the ends of light waveguides 20. Focusing microlenses 15 are also depicted, they may be omitted, however. The free beams 11 are guided through a window 21, which may be a simple glass pane, in the wall of the vacuum chamber 4 into the inside of the vacuum chamber 4. In order to provide shielding against interferences, the window 21 is provided with a cover 22. Because of the great distance between the light exit locations 10 and the light entry locations 12, an imaging lens 23 is provided, which images the respective locations onto one another. In particular, compact array-arrangements of light exit locations 10 and light entry locations 12, also in connection with readily removable fiber array plugs, may be imaged well using imaging optics 23, which is formed by a simple imaging lens in this instance. Also, if imaging optics 23 is used, the arrangement thereof should not impede particle beam 5, the free beams 11 may be guided along an angular path by using a deflection arrangement 24, which does not impede particle beam 5, either-, wherein said optical deflection arrangement receives all free beams 11 together, which are positioned close to one another.

Figure 3:
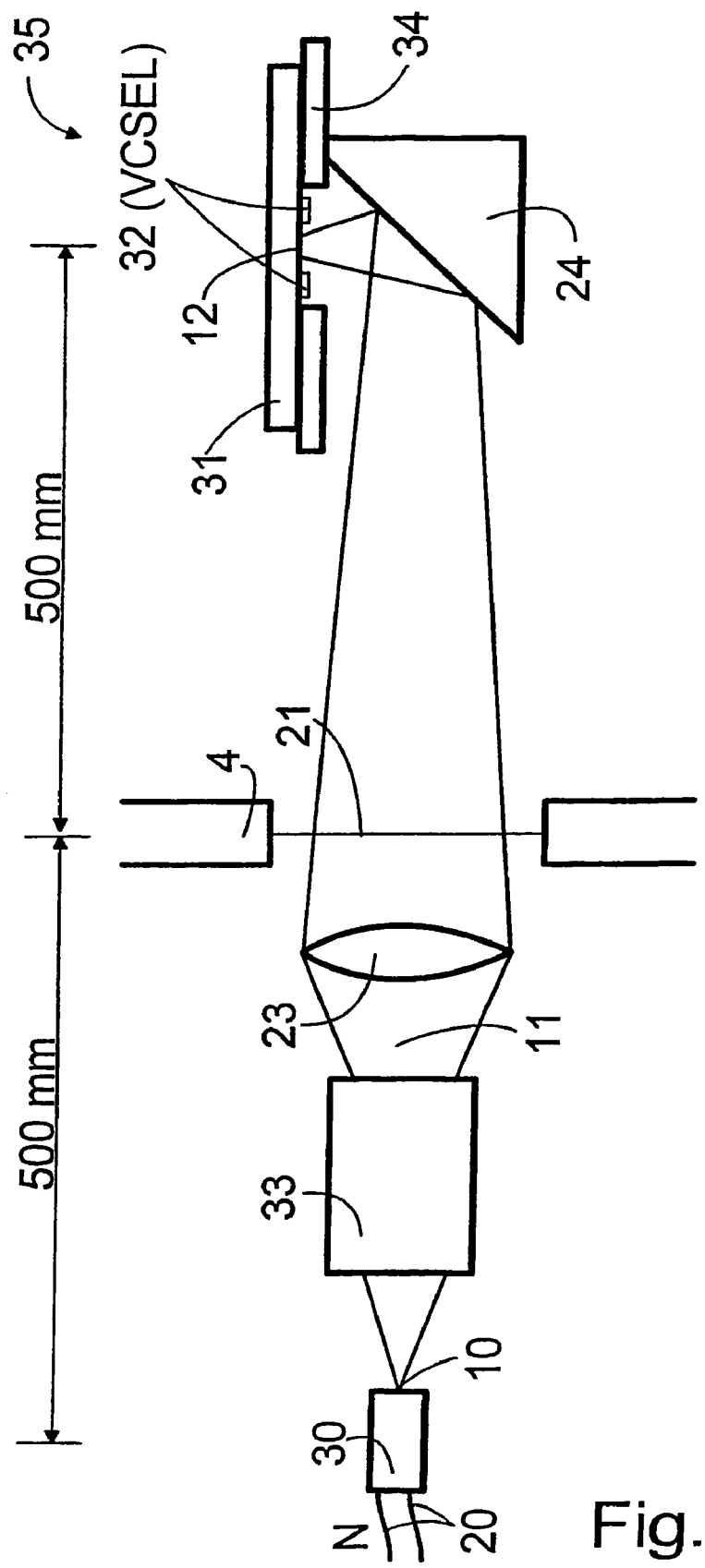
FIG. 3 shows a section of a further free beam connection system wherein light exit locations are disposed linearly outside the vacuum chamber.

FIG. 3 shows an embodiment of an arrangement, which is linear throughout, with dimensions indicated, and wherein the light exit locations 10 are disposed outside the vacuum chamber 4 (suggested only). These light exit locations 10 are formed by a fiber array plug 30. In the chosen embodiment, the fiber array plug 30 comprises (6×12) light waveguides 20 provided by glass fibers and two photodiodes (four quadrant) for receipt of feedback signals. The bundle of free beams 11 is guided via the imaging lens 23 through the window 21 and via an optical deflection arrangement 24 onto a photodiode array 31. Apart from the (6×12) photodiodes, the photodiode array 31 in the chosen embodiment also comprises two emitting lasers 32 (VCSEL) for generating feedback signals. These are guided back to the two photodiodes having a four-quadrant-configuration in fiber array plug 30 and serve to control the alignment of free beams 11 with the photodiode array 31. Any occurring deviation is optically compensated for in an adjustment system 33, which is suitable for automation, and which is disposed in the free beam path. A mechanical, automated or manual adjustment, for instance by a displacement of fiber array plug 30, is also possible. In the chosen embodiment, photodiode array 31, which is disposed on a carrier plate 34 having square openings, is configured as a combination with an electronic chip, and also comprises the first stop of the demultiplexer for distributing the received, opto-electrically converted pattern data. A further electronic chip having corresponding openings is not depicted. The entire system is referred to as programmable aperture plate system 35.

Figure 4:
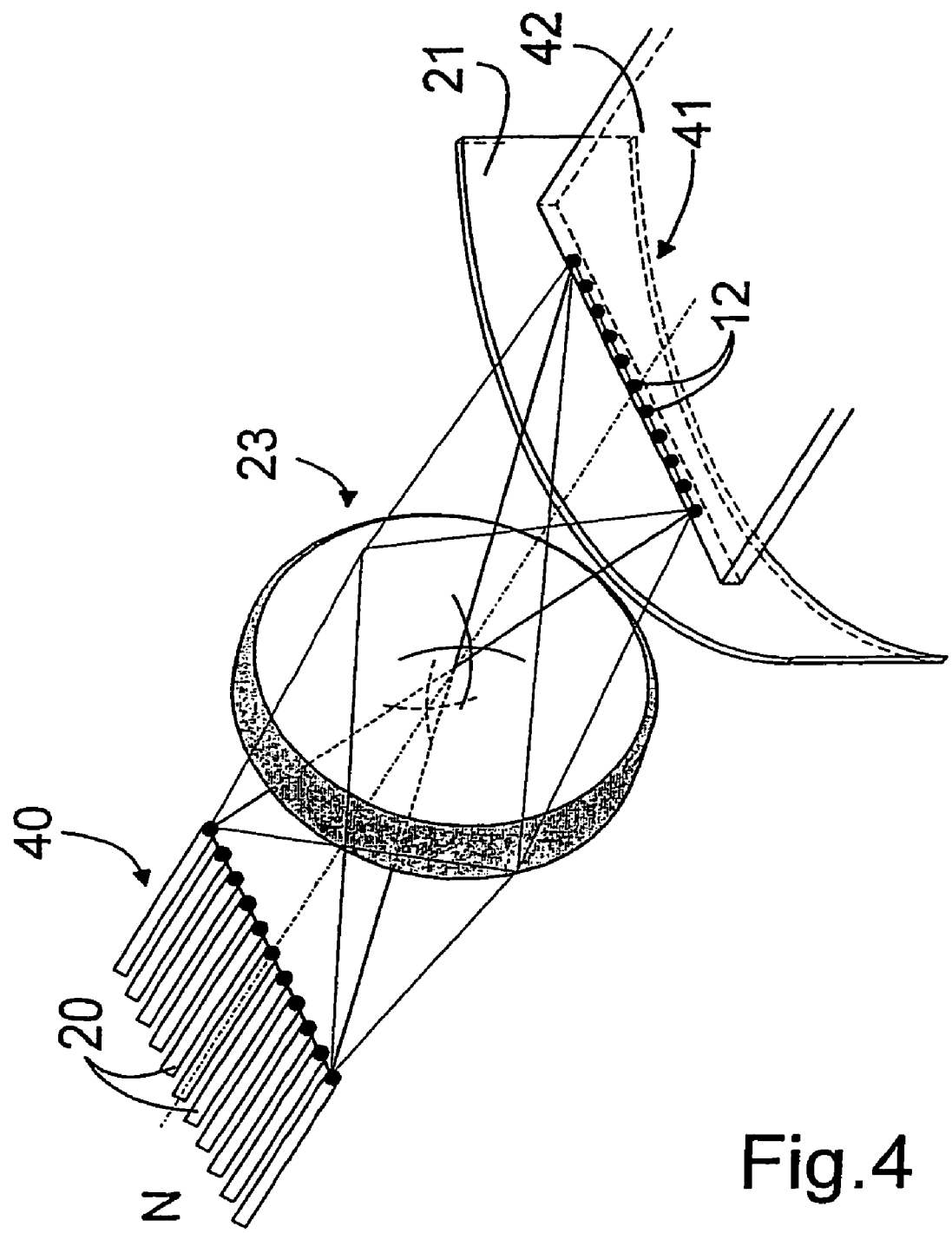
FIG. 4 shows a detailed illustration of a free beam connection system comprising an imaging lens.

Details of the imaging lens 23 may be derived from FIG. 4. Plural light waveguides 20 are combined therein to a line-shaped fiber array 40. A combination into lines and columns in a fiber array plug (see above) for achieving even more compact dimensions and a simpler assembly is also possible. A mirror-inverted image of the line-shaped fiber array 40 is imaged by the imaging lens 23 through the window 21 onto a line-shaped light entry array 41 (indicated in FIG. 3 by beam lines). An approximately 1:1-imaging optics 23 comprising a simple imaging lens is depicted, which allows a large working distance in the free beam path. In case of an asymmetric arrangement of imaging optic 23, other imaging ratios may be chosen. In the chosen embodiment, the light entry locations 12 are formed by photodiodes, which are monolithically integrated into a semiconductor chip 42, for instance made from silicon, for a transmission wavelength of 850 nm.

Figure 5:
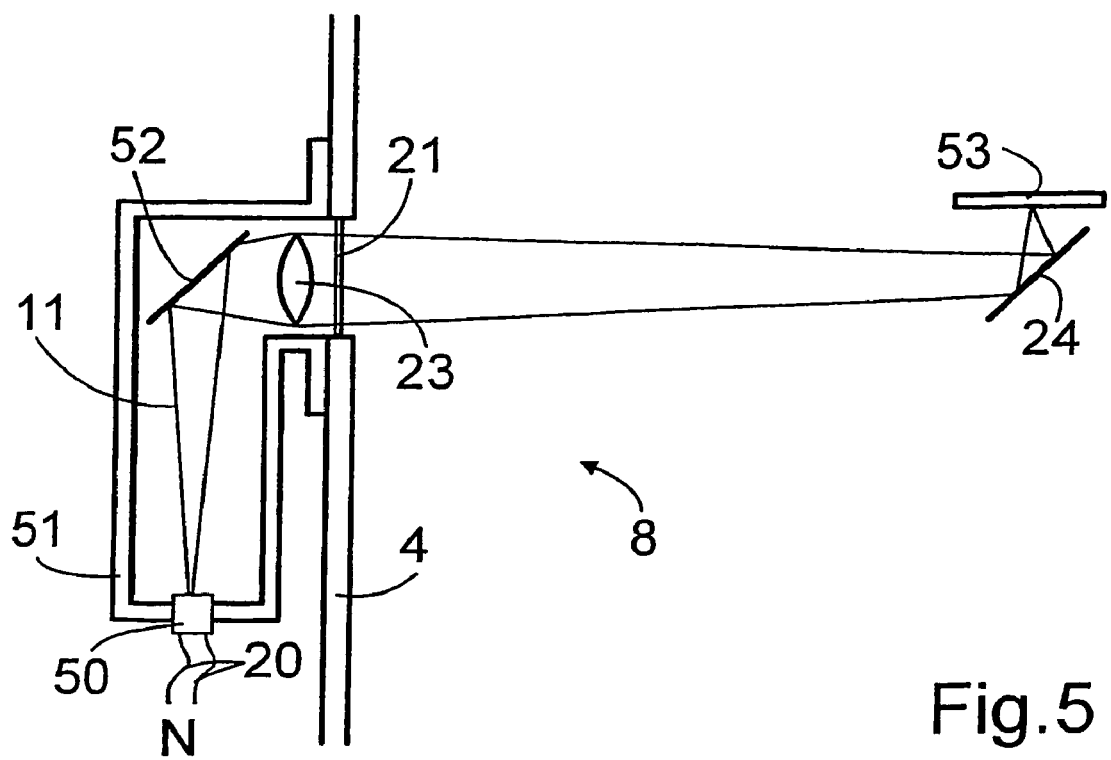
FIG. 5 shows a free beam connection system having light exit locations disposed at an angle outside the vacuum chamber.
Figure 6:
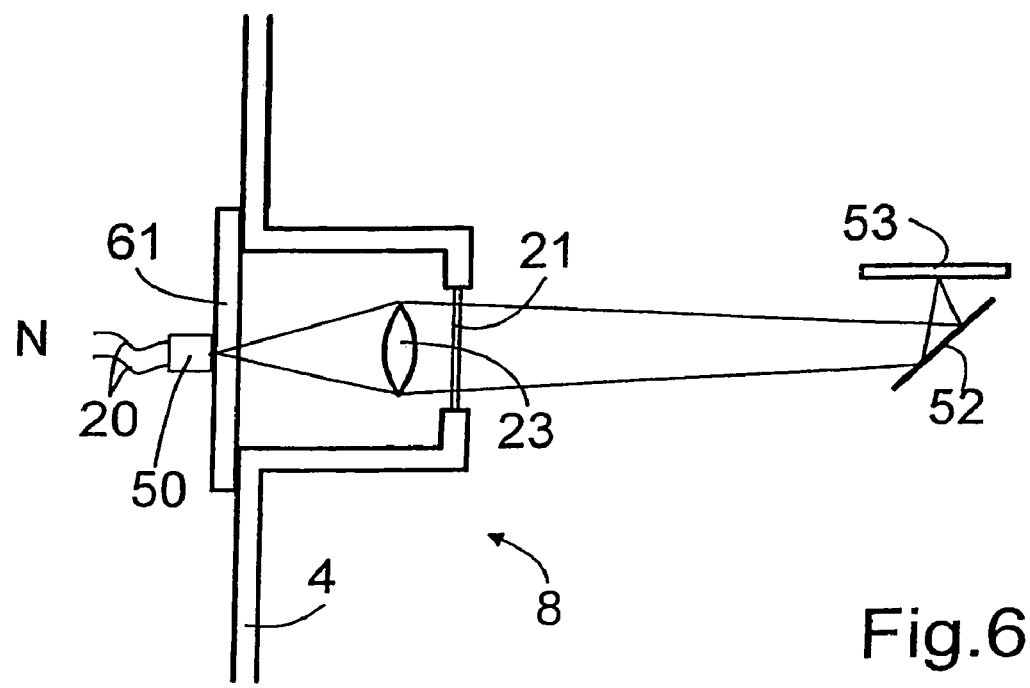
FIG. 6 shows a free beam connection system having light exit locations disposed outside of, but in a region of the vacuum chamber.
Figure 7:
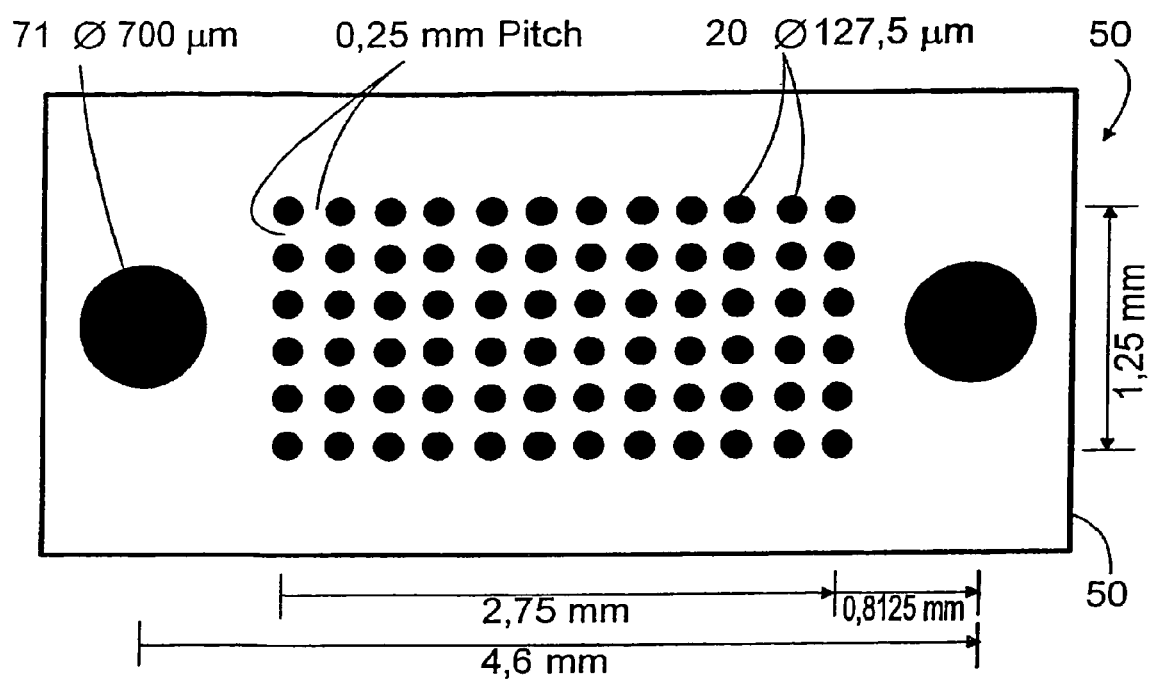
FIG. 7 shows a fiber array plug.

In FIG. 5, an embodiment comprising an arrangement of fiber array plugs 50, in which the ends of a number of N light waveguides 20 are combined, and further comprising an imaging lens 23 disposed outside the vacuum chamber 4 is depicted. The deflection of the bundle of free beams 11 is achieved by the additional optical deflection arrangement 52, which is disposed at about the same height as window 21. Both the fiber array plug 50 and the optical deflection arrangement 24 are integrated into an angular cover 51, which simultaneously serves as a mechanical fixation and a shield against optical interfering influences, and also serves to protect imaging lens 23. A further optical deflection arrangement 24 is disposed inside the vacuum chamber 4 which, in the chosen embodiment, guides the bundle of free beams 11 onto a photodiode array 53. In FIG. 6, an embodiment similar to that of FIG. 5 is depicted, wherein the window 21 is now recessed into the vacuum chamber 4. The fiber array plug 50 is mounted to a plate 61, which simultaneously serves the purpose of shielding from optical interferences. The imaging optics 23 is disposed exactly in front of the window 21. Using this arrangement, smaller dimensions of the free beam connection system 8, and thus more compact constructional dimensions are achievable. In FIG. 7, a front view of fiber array plug 50 comprising two openings 71 for fixation is depicted and dimensions thereof indicated, which plug comprises, in the depicted embodiment, six lines with twelve light waveguides 20 each, which have a predetermined, in this instance the same pitch distance in the vertical and horizontal direction.

Figure 9:
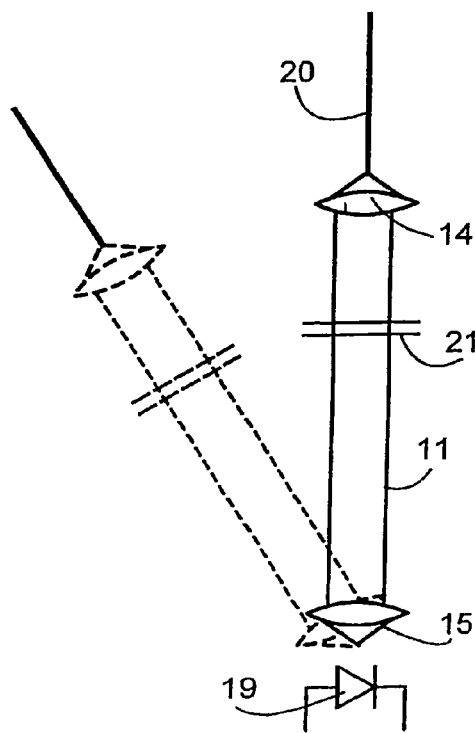
FIG. 9 shows an angular free beam path.
Figure 8:
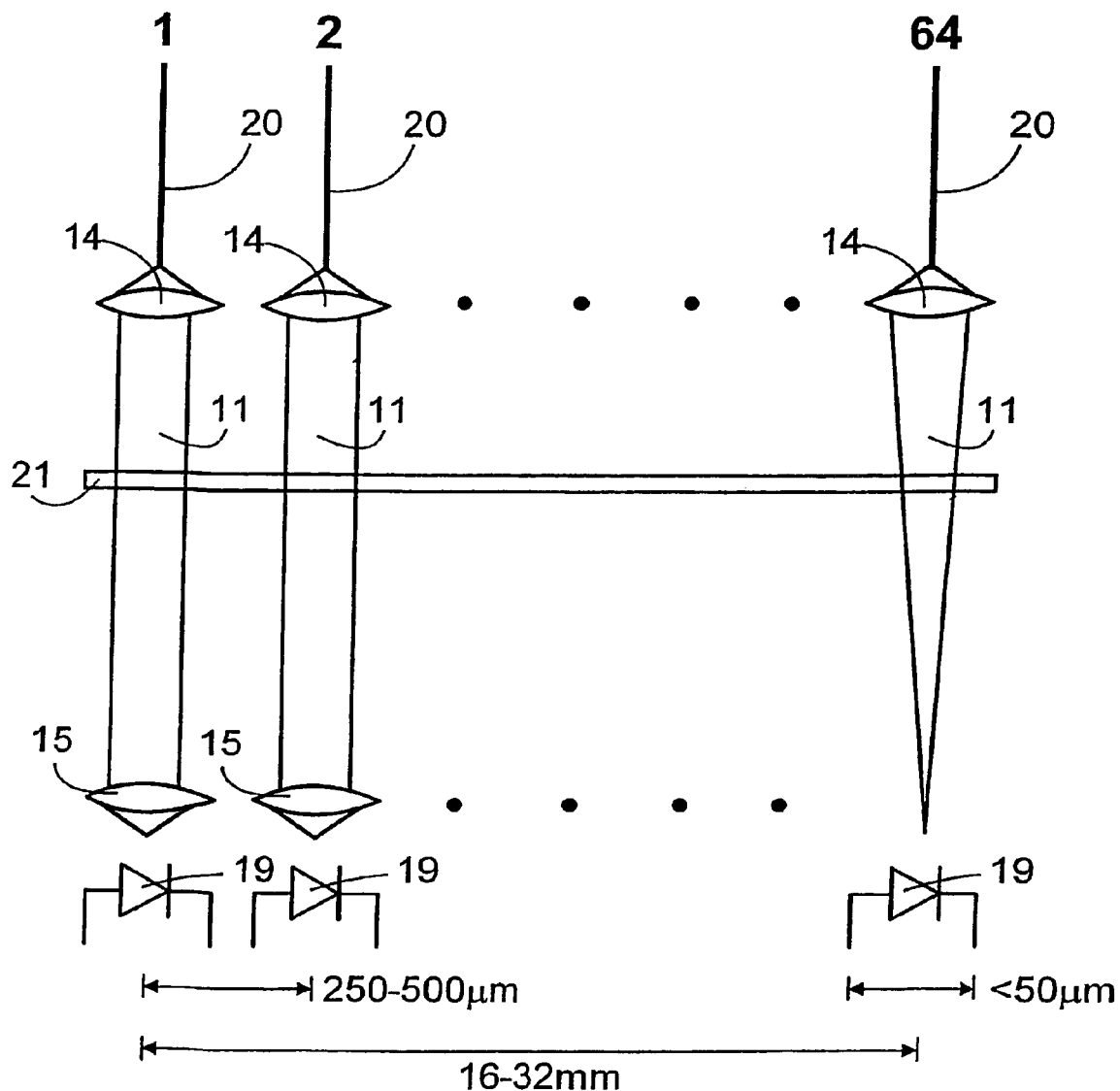
FIG. 8 shows free beams and microlenses.

In FIG. 8, possible arrangements of collimating microlenses 14 and focusing micro-lenses 15 in the free beams 11 to both sides of window 21 are depicted, with dimensions of the arrangements being indicated. The focusing micro-lenses 15 in front of photodiode 19 may optionally be omitted (in FIG. 8 only indicated on the right hand side). 1 ... 64 light waveguides 20 according to the chosen embodiment are depicted. In FIG. 9, the possible angular irradiation into the photodiode 19 is depicted. This is realized by a suitable rotation (indicated by dotted lines) of the focusing micro-lenses 15 and window 21 and allows to adjust the orientation of free beams 11 to the spatial surroundings in the vacuum chamber 4.

Figure 10:
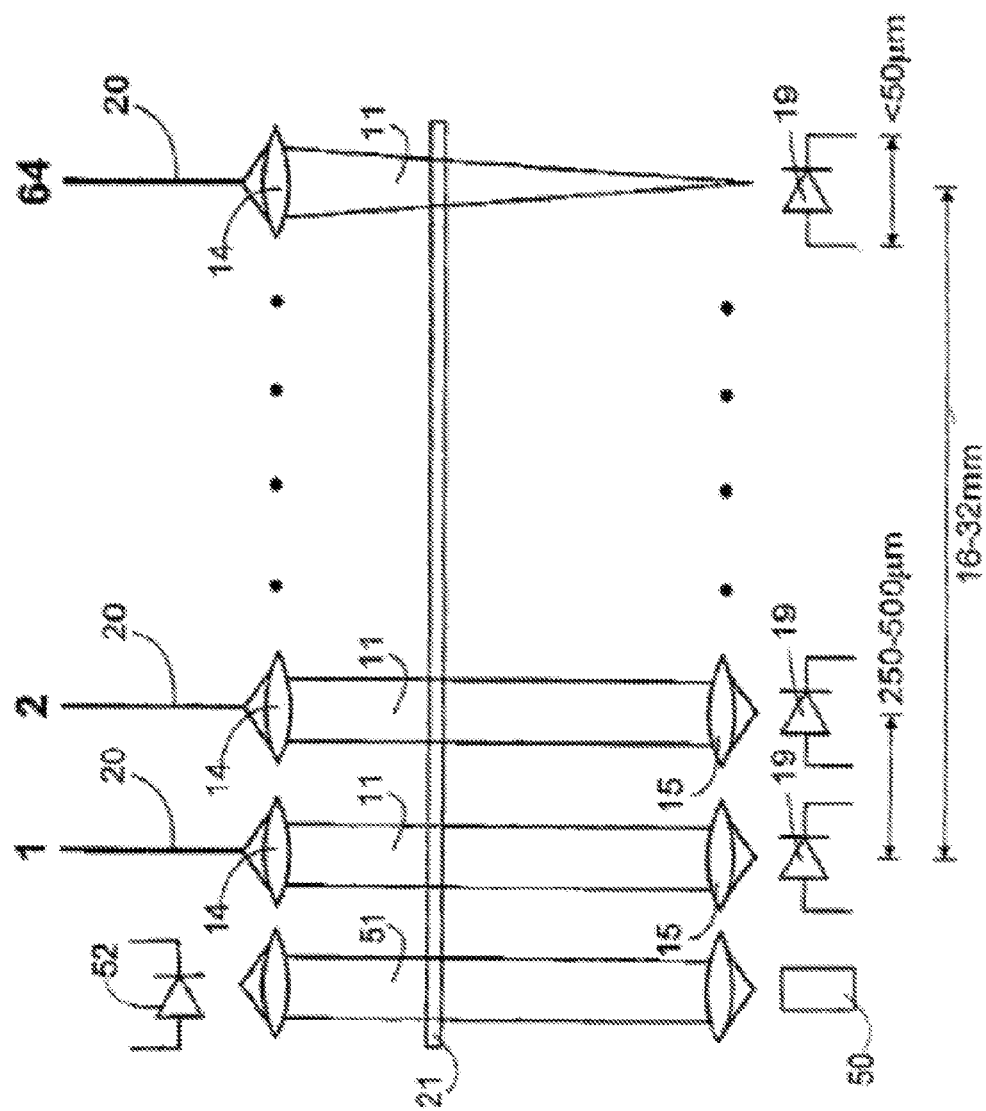
FIG. 10 shows another preferred embodiment of free beams and microlenses.

As is illustrated in FIG. 10, additional electro-optical converters 50 could be disposed in a region of the pattern generating system, by which further optical signals in a back direction, in particular monitoring and control signals, may be generated and guided via free beams 51 onto additional opto-electrical converters 52, wherein the further optical signals may be used as feedback signals for the adjustment system, which may be automated.

In the drawings illustrating exemplary embodiments reference numeral 1 refers to a lithography system, 2 refers to a substrate, 3 refers to a mounting table, 4 refers to a vacuum chamber, 5 refers to a particle beam, 6 refers to a pattern generating system, 7 refers to an aperture, 8 refers to a free beam connection system, 9 refers to an electro-optical converter, 10 refers to a light exit location, 11 refers to a free beam, 12 refers to a light entry location, 13 refers to an opto-electrical converter, 14 refers to a collimating micro lens, 15 refers to a focusing micro lens, 16 refers to a optical deflection arrangement, 17 refers to an emitting laser, 18 refers to a passage, 19 refers to a photodiode, 20 refers to a light waveguide (number N), 21 refers to a window, 22 refers to a cover, 23 refers to imaging optics, 24 refers to an optical deflection arrangement, 30 refers to a fiber array plug, 31 refers to a photodiode array, 32 refers to an emitting laser, 33 refers to an adjustment system, 34 refers to a carrier plate, 35 refers to an aperture plate system, 40 refers to a fiber array, 41 refers to a light entry array, 42 refers to a semiconductor chip, 50 refers to a fiber array plug, 51 refers to a cover, 52 refers to an additional optical deflection arrangement, 53 refers to a photodiode array, 61 refers to a plate, and 71 refers to an opening for fixation.

The present invention has been described by way of exemplary embodiments to which it is not limited. Variations and modifications will occur to those skilled in the art without departing from the scope of the present invention as recited in the appended claims and equivalents thereof.

What is claimed is:

1. A maskless lithography system for direct, nano-scaleable structuring of a substrate disposed in a vacuum chamber using a charged particle beam, and a high voltage present within the vacuum chamber, comprising:

a mounting table for supporting the substrate when the substrate is structured;

a beam source for generating the charged particle beam;

an addressable pattern generating system which is configured as a plate system; and a data transmission system configured to transmit a structure pattern to be produced to the pattern generating system as a set of pattern data generated via computer, wherein said data transmission system comprises electro-optical converters and opto-electrical converters; wherein said data transmission system is an opto-electrical free-space optical beam connection system and is configured to distribute the pattern data, which has been optically converted by the electro-optical converters via light exit locations and light entry locations and in adjustably oriented free-space optical beams between the light exit locations and the light entry locations, to the opto-electrical converters, with the light entry locations residing inside the vacuum chamber and being arranged in an array, and the opto-electrical converters being associated with the pattern generating system with respect to the transmitted pattern data;

the opto-electrical converters are spatially disposed directly within the plate system;

the number N of the electro-optical converters is adapted to the rate of pattern data to be transmitted, based on their predetermined conversion rate; and optical deflection arrangements are disposed in the free-space optical beams inside the vacuum chamber.

2. The maskless lithography system according to claim 1, further comprising the vacuum chamber, wherein the light exit locations are disposed outside the vacuum chamber, and wherein the free-space optical beams are guided into the vacuum chamber through a transparent window in the vacuum chamber.

3. The maskless lithography system according to claim 2, wherein the window is shielded by a cover against external light and electromagnetic fields, outside of where the free-space optical beams pass through.

4. The maskless lithography system according to claim 1, wherein collimating and focusing microlenses are disposed at least one of the light exit locations and the light entry locations.

5. The maskless lithography system according to claim 1, wherein at least one of the light entry locations and the light exit locations are arranged in an array.

6. The maskless lithography system according to claim 5, wherein the array of the light exit locations is imaged by imaging optics onto the array of the light entry locations.

7. The maskless lithography system according to claim 1, wherein at least one of the light entry locations and the light exit locations are formed by the ends of light waveguides.

8. The maskless lithography system according to claim 7, wherein the ends of the light waveguides, when formed by light fibres, are combined into a fibre array plug.

9. The maskless lithography system according to claim 1, wherein the electro-optical converters serving as light exit locations are formed by active emitting elements.

10. The maskless lithography system according to claim 1, wherein the opto-electrical converters serving as light entry locations are formed by active receiving elements.

11. The maskless lithography system according to claim 1, wherein the light entry locations and the light exit locations are arranged inside the vacuum chamber.

12. The maskless lithography system according to claim 1, wherein the addressable pattern generating system comprises a blanking plate having a plurality of addressable apertures for modulating the charged particle beam based on the set of pattern data, wherein the opto-electrical converters are distributed over the blanking plate and are allocated there to groups of the plurality of addressable apertures.

13. The maskless lithography system according to claim 1, wherein the plate system includes a plate and the opto-electrical converters are disposed on one of the main surfaces of the plate, the plate having a plurality of addressable elements for modulating the charged particle beam based on the pattern data.

14. A maskless lithography system for direct, nano-scaleable structuring of a substrate disposed in a vacuum chamber using a charged particle beam, and a high voltage present in the vacuum chamber, comprising:

a mounting table for disposing the substrate on same when the substrate is structured, a beam source for generating the charged particle beam;

an addressable pattern generating system which is configured as a plate system;

a data transmission system configured to transmit a structure pattern to be produced to the pattern generating system as a set of pattern data generated with computer aid; wherein said data transmission system comprises electro-optical converters and opto-electrical converters; wherein said data transmission system is an opto-electrical free-space optical beam connection system and is configured to distribute the pattern data which has been optically converted by the electro-optical converters via light exit locations and light entry locations and in adjustably oriented free-space optical beams between the light exit locations and the light entry locations, to the opto-electrical converters, with the light entry locations residing inside the vacuum chamber and being arranged in an array, and the opto-electrical converters being associated with the pattern generating system with respect to the transmitted pattern data;

the opto-electrical converters are spatially disposed directly within the plate system; and the number N of the electro-optical converters is adapted to the rate of pattern data to be transmitted, based on their predetermined conversion rate; and the pattern generating system is configured to be powered, at least partially, by energy transmitted via the free-space optical beams from the light exit locations to the light entry locations.

15. The maskless lithography system according to claim 14, further comprising the vacuum chamber, wherein the light entry locations are arranged inside of the vacuum chamber and the light exit locations are disposed outside the vacuum chamber, and wherein the free-space optical beams are guided into the vacuum chamber through a transparent window in the vacuum chamber.

16. The maskless lithography system according to claim 14, wherein the pattern generating system is configured to load an energy storage with the energy transmitted via the free-space optical beams from the light exit locations to the light entry locations, and to power internal processes within the pattern generating system for energy stored within the energy storage.

17. A maskless lithography system for direct, nano-scaleable structuring of a substrate disposed in a vacuum chamber using a charged particle beam, and a high voltage, comprising a vacuum chamber within which the high voltage is present;

a mounting table for disposing the substrate on same when the substrate is structured, a beam source for generating the charged particle beam;

an addressable pattern generating system which is configured as a plate system;

a data transmission system configured to transmit a structure pattern to be produced to the pattern generating system as a set of pattern data generated with computer aid; wherein said data transmission system comprises electro-optical converters and opto-electrical converters; wherein said data transmission system is an opto-electrical free-space optical beam connection system and is configured to distribute the pattern data which has been optically converted by the electro-optical converters via light exit locations and light entry locations and in adjustably oriented free-space optical beams between the light exit locations and the light entry locations, to the opto-electrical converters, with the light entry locations residing inside the vacuum chamber and being arranged in an array, and the opto-electrical converters being associated with the pattern generating system with respect to the transmitted pattern data;

the opto-electrical converters are spatially disposed directly within the plate system;

the light entry locations are arranged inside the vacuum chamber and the light exit locations are disposed outside the vacuum chamber, and the free-space optical beams are guided into the vacuum chamber through a transparent window in the vacuum chamber;

the number N of the electro-optical converters is adapted to the rate of pattern data to be transmitted, based on their predetermined conversion rate; and additional electro-optical converters are disposed within the pattern generating system, for generating monitoring and control signals and guiding them in a back direction via further free-space optical beams onto additional opto-electrical converters; and an adjustment system being configured to, using said monitoring and control signals as received via the additional opto-electrical converters as feedback signals, align the free-space optical beams with the light entry locations by:

correcting a position of the light exit locations; or correcting a position of the optics in a beam path along which the free-space optical beams are guided from the light exit locations to the light entry locations.

18. The maskless lithography system according to claim 7, wherein the adjustment system is disposed in the beam path of the free-space optical beam connection system.

19. A method of maskless lithography, comprising:

generating a charged particle beam using a beam source within a vacuum chamber;

directing the charged particle beam to an addressable pattern generating system configured as a plate system;

supplying pattern data to a plurality of electro-optical converters, and converting the pattern data to corresponding optical signals respectively carried by a plurality of free-space optical beams;

directing the plurality of free-space optical beams via light exit locations and light entry locations being spaced apart from each other to multiple opto-electrical converters, and converting the optical signals corresponding to the set of pattern data to control the plate system; wherein the light entry locations are arranged inside the vacuum chamber and the light exit locations are disposed outside the vacuum chamber, and the free-space optical beams are guided into the vacuum chamber through a transparent window in the vacuum chamber;

the opto-electrical converters are spatially disposed directly within the plate system;

by use of additional electro-optical converters disposed within the pattern generating system, generating monitoring and control signals and guiding them in a back direction via further free-space optical beams onto additional opto-electrical converters; and using the monitoring and control signals as received via the additional opto-electrical converters as feedback signals, aligning the free-space optical beams with the light entry locations by:
    correcting a position of the light exit locations; or
    correcting a position of the optics in a beam path along which the free-space optical beams are guided from the light exit locations to the light entry locations.

20. The method of claim 19, wherein a path of the charged particles at least partially overlaps with a path of the free-space optical beams traveling in between the light exit locations and the light entry locations.

21. A maskless lithography system for direct, nano-scaleable structuring of a substrate disposed in a vacuum chamber using a charged particle beam, and a high voltage present within the vacuum chamber, the system comprising:
    a mounting table for disposing the substrate on same when the substrate is structured,
    a beam source for generating the charged particle beam;
    an addressable pattern generating system; and
    a data transmission system configured to transmit a structure pattern to be produced to the pattern generating system as a set of pattern data generated with computer aid; wherein
    said data transmission system comprises electro-optical converters and opto-electrical converters; wherein
        said data transmission system is an opto-electrical free-space optical beam connection system and is configured to distribute the pattern data which has been optically converted by the electro-optical converters via light exit locations and light entry locations and in adjustably oriented free-space optical beams between the light exit locations and the light entry locations, to the opto-electrical converters, with the light entry locations residing inside the vacuum chamber and being arranged in an array, and the opto-electrical converters being associated with the pattern generating system with respect to the transmitted pattern data;
    the data transmission system is further configured such that a path of the charged particles at least partially overlaps with a path of the free-space optical beams travelling in between the light exit locations and the light entry locations;
    additional electro-optical converters are disposed within the pattern generating system, for generating monitoring and control signals and guiding them in a back direction via further free-space optical beams onto additional opto-electrical converters; and
    the maskless lithography system further comprises an automatable adjustment system being configured to, using said monitoring and control signals as received via the additional opto-electrical converters as feedback signals, align the free-space optical beams with the light entry locations by:
        correcting a position of the light exit locations; or
        correcting a position of the optics in a beam path along which the free-space optical beams are guided from the light exit locations to the light entry locations.

22. The maskless lithography system according to claim 1, further comprising the vacuum chamber, wherein the light entry locations are arranged inside of the vacuum chamber and the light exit locations are disposed outside the vacuum chamber, and wherein the free-space optical beams are guided into the vacuum chamber through a transparent window in the vacuum chamber.

23. The maskless lithography system according to claim 22, wherein the light exit locations are disposed directly at the window from the outside.

24. The maskless lithography system according to claim 22, wherein the light exit locations are disposed orthogonally beneath the window, and wherein the free-space optical beams are guided by an additional optical deflection arrangement through the window into the vacuum chamber.

25. The maskless lithography system according to claim 22, wherein the window is recessed into the vacuum chamber.

* * * * *

UNITED STATES PATENT AND TRADEMARK OFFICE
CERTIFICATE OF CORRECTION

| | |
|---|---|
| PATENT NO. | : 7,728,313 B2 |
| APPLICATION NO. | : 11/260165 |
| DATED | : June 1, 2010 |
| INVENTOR(S) | : Godehard Walf et al. |

It is certified that error appears in the above-identified patent and that said Letters Patent is hereby corrected as shown below:

Column 14, line 37: Claim 18 should read as follows:

A maskless lithography system according to claim 17 ...

Signed and Sealed this
Twenty-eighth Day of December, 2010

David J. Kappos
*Director of the United States Patent and Trademark Office*